(12) United States Patent
Nishiwaki et al.

(10) Patent No.: US 8,872,192 B2
(45) Date of Patent: Oct. 28, 2014

(54) RECTIFIER CIRCUIT

(71) Applicant: Kabushiki Kaisha Toshiba, Tokyo (JP)

(72) Inventors: Tatsuya Nishiwaki, Himeji (JP); Akira Yoshioka, Yokohama (JP); Yasunobu Saito, Tokyo (JP); Masatoshi Arai, Himeji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 60 days.

(21) Appl. No.: 13/780,444

(22) Filed: Feb. 28, 2013

(65) Prior Publication Data
US 2013/0341641 A1    Dec. 26, 2013

(30) Foreign Application Priority Data

Jun. 22, 2012 (JP) ................................. 2012-140874
Feb. 18, 2013 (JP) ................................. 2013-029340

(51) Int. Cl.
*H01L 21/00* (2006.01)
*H01L 27/07* (2006.01)
*H01L 27/06* (2006.01)

(52) U.S. Cl.
CPC ......... *H01L 27/0727* (2013.01); *H01L 27/0629* (2013.01)
USPC ............................. 257/77; 257/133; 257/194

(58) Field of Classification Search
CPC ....................... H01L 27/0727; H01L 27/0629
USPC .......................................... 257/77, 194, 133
See application file for complete search history.

(56) References Cited

U.S. PATENT DOCUMENTS

| 7,071,518 | B2 | 7/2006 | Parthasarathy et al. |
| 7,825,435 | B2 | 11/2010 | Machida et al. |
| 7,978,499 | B2 * | 7/2011 | Hosono et al. ................. 365/148 |
| 2005/0275055 | A1 | 12/2005 | Parthasarathy et al. |
| 2007/0247006 | A1 * | 10/2007 | Ball .............................. 307/139 |
| 2008/0191216 | A1 | 8/2008 | Machida et al. |
| 2010/0091551 | A1 * | 4/2010 | Hosono et al. ................. 365/148 |
| 2011/0254056 | A1 | 10/2011 | Machida et al. |
| 2012/0235209 | A1 * | 9/2012 | Briere et al. ................... 257/194 |
| 2013/0341641 | A1 * | 12/2013 | Nishiwaki et al. ............... 257/77 |
| 2014/0152276 | A1 * | 6/2014 | Kobayashi et al. ........... 323/271 |

FOREIGN PATENT DOCUMENTS

JP    2011-135094 A    7/2011

* cited by examiner

*Primary Examiner* — Laura Menz
(74) *Attorney, Agent, or Firm* — Holtz, Holtz, Goodman & Chick PC

(57) ABSTRACT

A rectifier circuit has a rectifier element and a unipolar field-effect transistor connected in series between a first terminal and a second terminal. The rectifier element comprises a first electrode and a second electrode disposed in a direction of a forward current flowing from the first terminal to the second terminal. The field-effect transistor has a gate electrode having a potential identical to a potential at the first electrode, and a source electrode and a drain electrode connected in series to the rectifier element and passing a current depending on the potential at the gate electrode. A breakdown voltage between the gate electrode and drain electrode of the field-effect transistor in a reverse bias mode, where a potential at the second terminal is higher than a potential at the first terminal, being set higher than a breakdown voltage of the rectifier element.

20 Claims, 16 Drawing Sheets

US 8,872,192 B2

RECTIFIER CIRCUIT

CROSS REFERENCE TO RELATED APPLICATIONS

This application is based upon and claims the benefit of priority from the prior Japanese Patent Applications No. 2012-140874, filed on Jun. 22, 2012 and No. 2013-29340, filed on Feb. 18, 2013, the entire contents of which are incorporated herein by reference.

FIELD

Embodiments of the present invention relate to a rectifier circuit conducting rectifying operation.

BACKGROUND

A technique has been proposed in which a rectifier circuit is fabricated by combining a silicon Schottky barrier diode and a normally-on type GaN-HEMT (hereinafter referred to simply as HEMT). This technique makes it possible to produce a rectifier circuit having shorter reverse recovery time and higher voltage resistance than a general silicon PIN (P-Intrinsic-N) diode.

According to this technique, however, under a reverse bias mode, reverse leakage current flows through the Schottky barrier diode. The HEMT operates in a weak ON state, and thus leakage current flows through the HEMT while high voltage is applied between the drain and source of the HEMT. Accordingly, when the leakage current flowing through the Schottky barrier diode is high, the HEMT is operated beyond its safe operating area (SOA: Safe Operating Area), which leads to a breakdown of the HEMT.

Further, when the above rectifier circuit is used for AC operation or dynamic operation, at the timing of switching the rectifier circuit from a forward bias mode to a reverse bias mode, current for charging the junction capacitance of the Schottky barrier diode also flows between the drain and source of the HEMT. At this time, the HEMT is operated beyond its safe operating area since high voltage is applied between the drain and source thereof, which also leads to the breakdown of the HEMT.

When a Schottky barrier diode having low reverse leakage current is used in order to solve these problems, voltage applied to the Schottky barrier diode becomes excessively high and the Schottky barrier diode may possibly be broken down.

Figure 1:
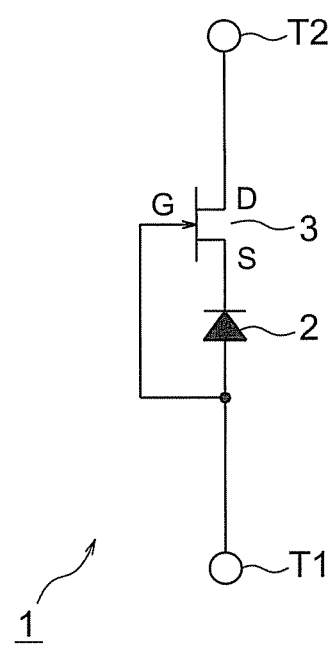
FIG. 1 is a circuit diagram of a rectifier circuit 1 according to first embodiment.

Each of FIGS. 2(a) to (c) is a diagram showing voltage-current characteristics when using a GaN-FET as a FET 3 in the rectifier circuit 1 of FIG. 1 and using a silicon Schottky barrier diode as a rectifier element 2.

Figure 2:
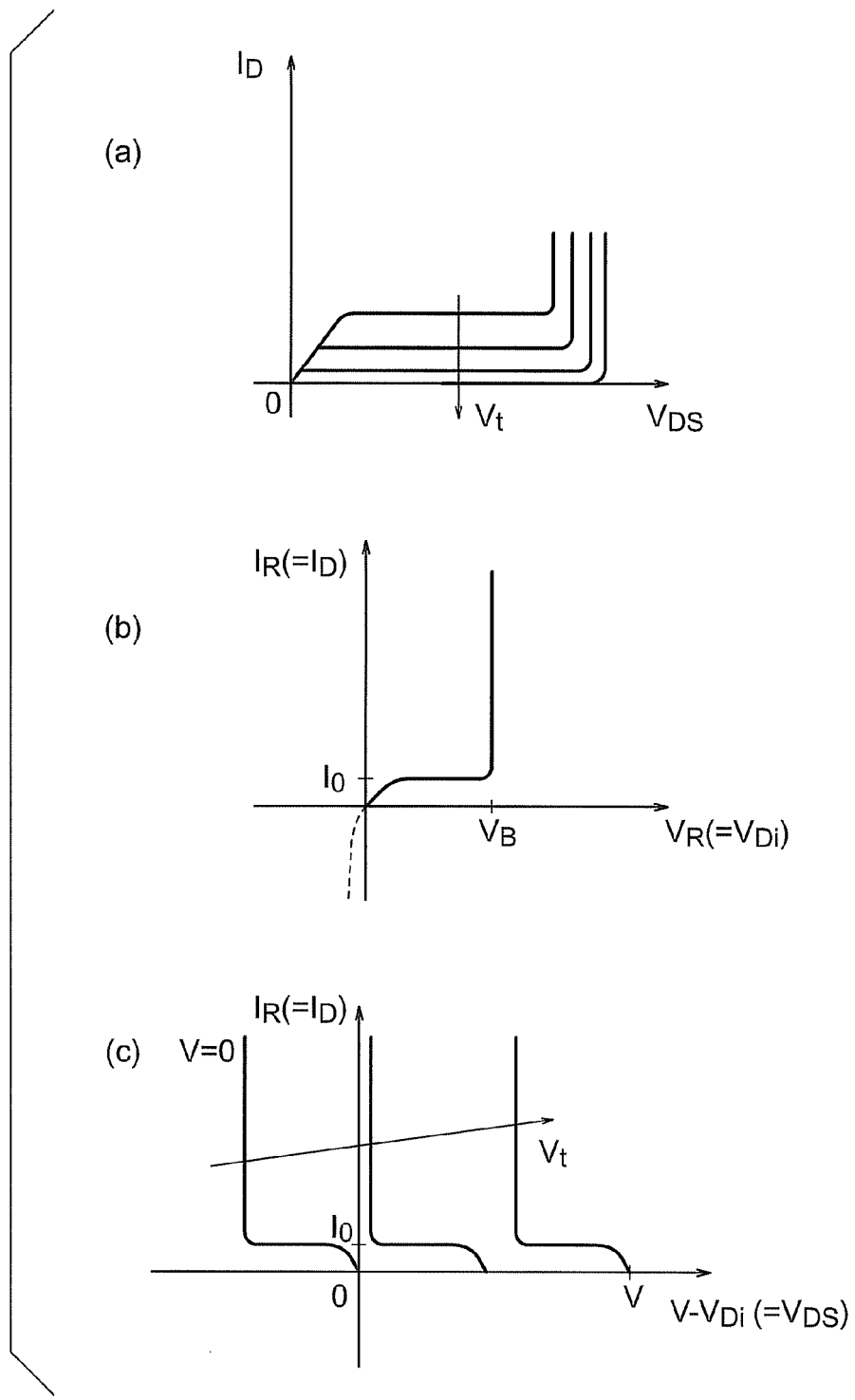
Figure 3:
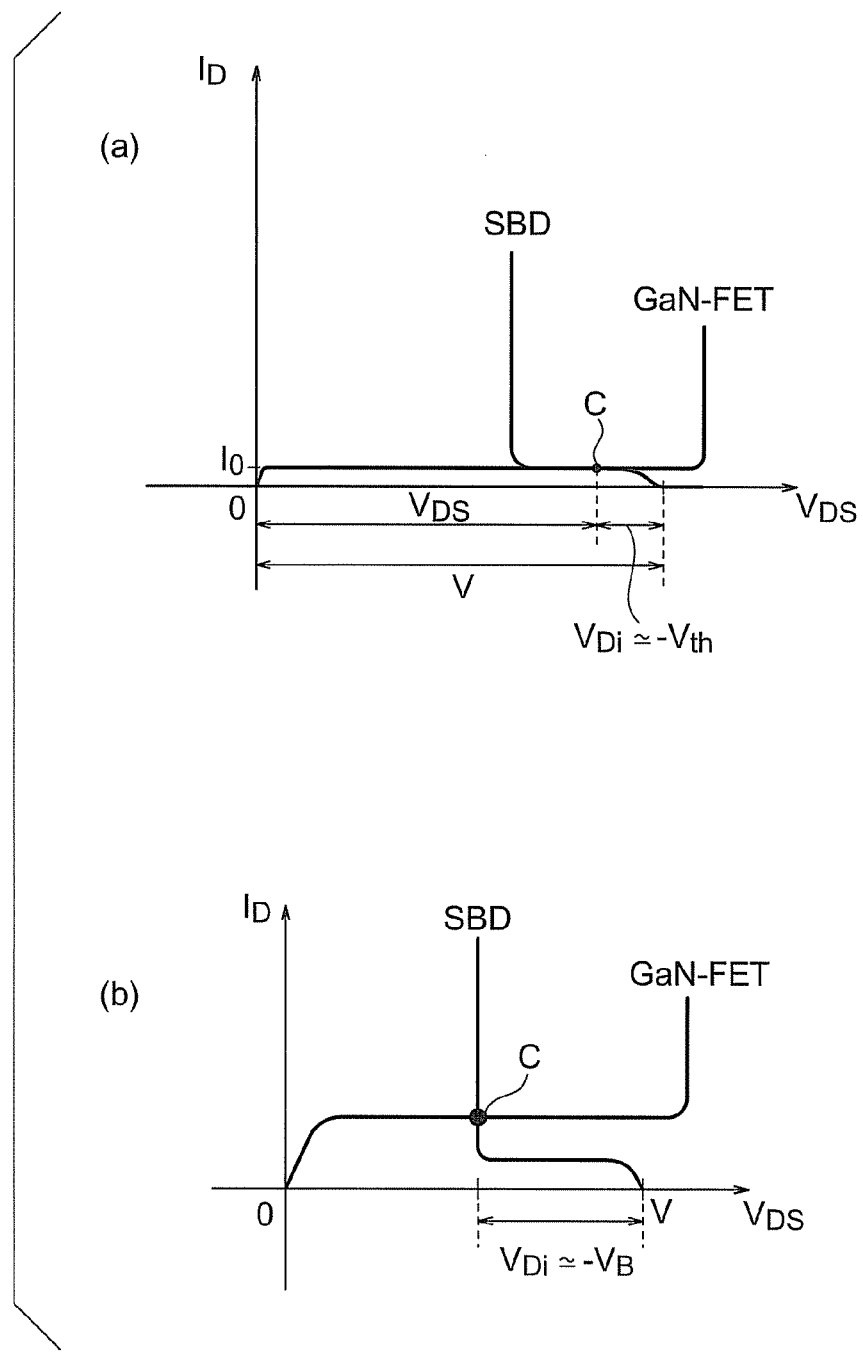

FIG. 3 (a) is a diagram showing the superposition of the characteristic curve of the FET 3 shown in FIG. 2(a) on the characteristic curve of the rectifier element 2 shown in FIG. 2(c), while FIG. 3 (b) is a diagram showing a state where an operating point is deviated.

Figure 4:
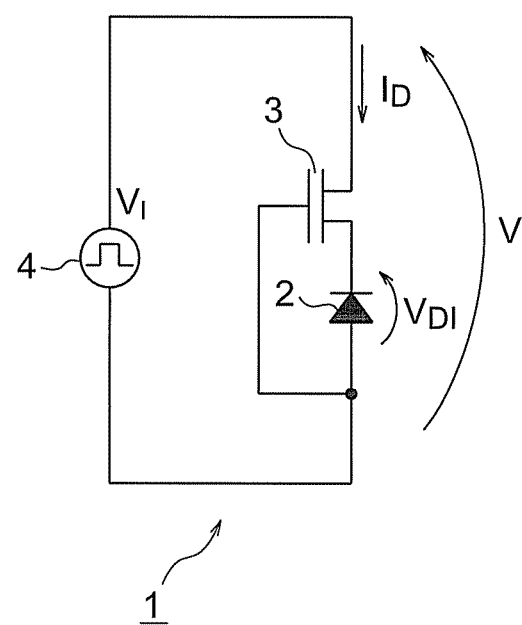

FIG. 4 is a circuit diagram when an alternating-current voltage source 4 is connected to terminals T1 and T2 of the rectifier circuit 1 of FIG. 1.

Each of FIGS. 5(a) to (c) is a waveform diagram of each area of the rectifier circuit 1 of FIG. 1 when the alternating-current voltage source of FIG. 4 is connected.

Figure 6:
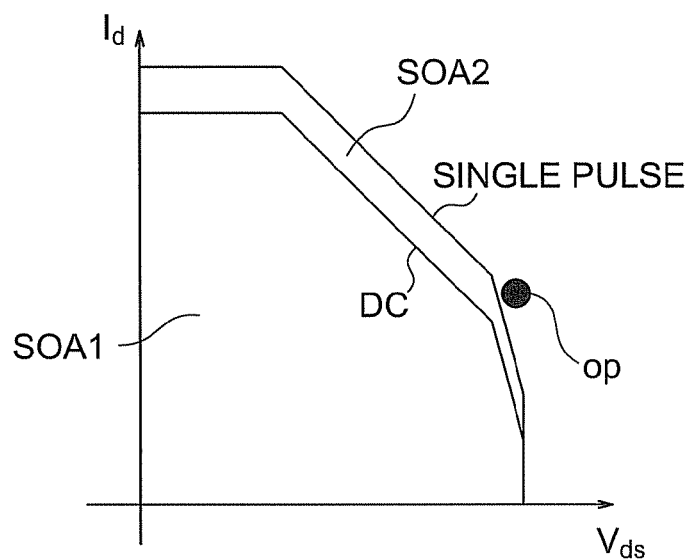

FIG. 6 is a diagram showing an example of a safe operating area (SOA) when using a GaN-FET as the FET 3.

FIG. 7(a) is a diagram showing that an inductor element 5 is connected between the terminal T2 and the drain of the FET 3 in the rectifier circuit 1 of FIG. 1, while FIG. 7(b) is a diagram showing that the inductor element 5 is connected between the source of the FET 3 and the cathode of the rectifier element 2.

Figure 8:
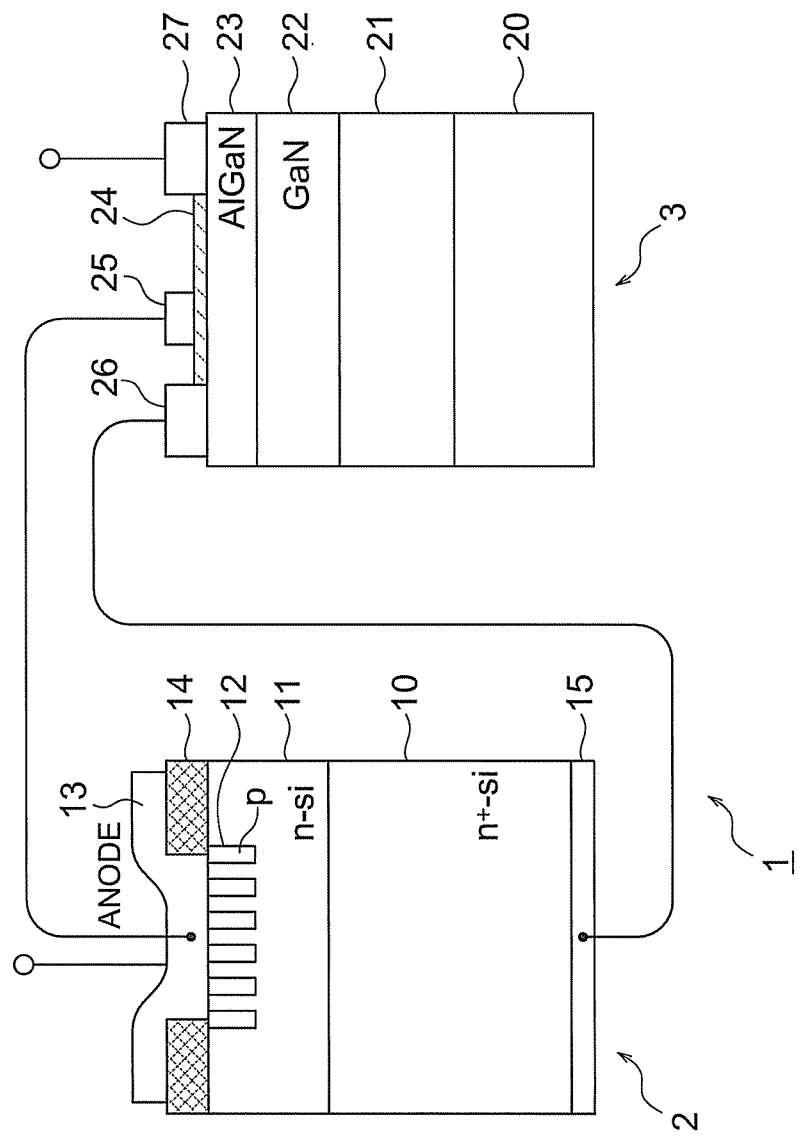

FIG. 8 is a sectional view of the rectifier circuit 1 when the rectifier element 2 functioning as a Schottky barrier diode having a JBS structure and the FET 3 functioning as a MIS-type GaN-FET are discrete parts.

Figure 9:
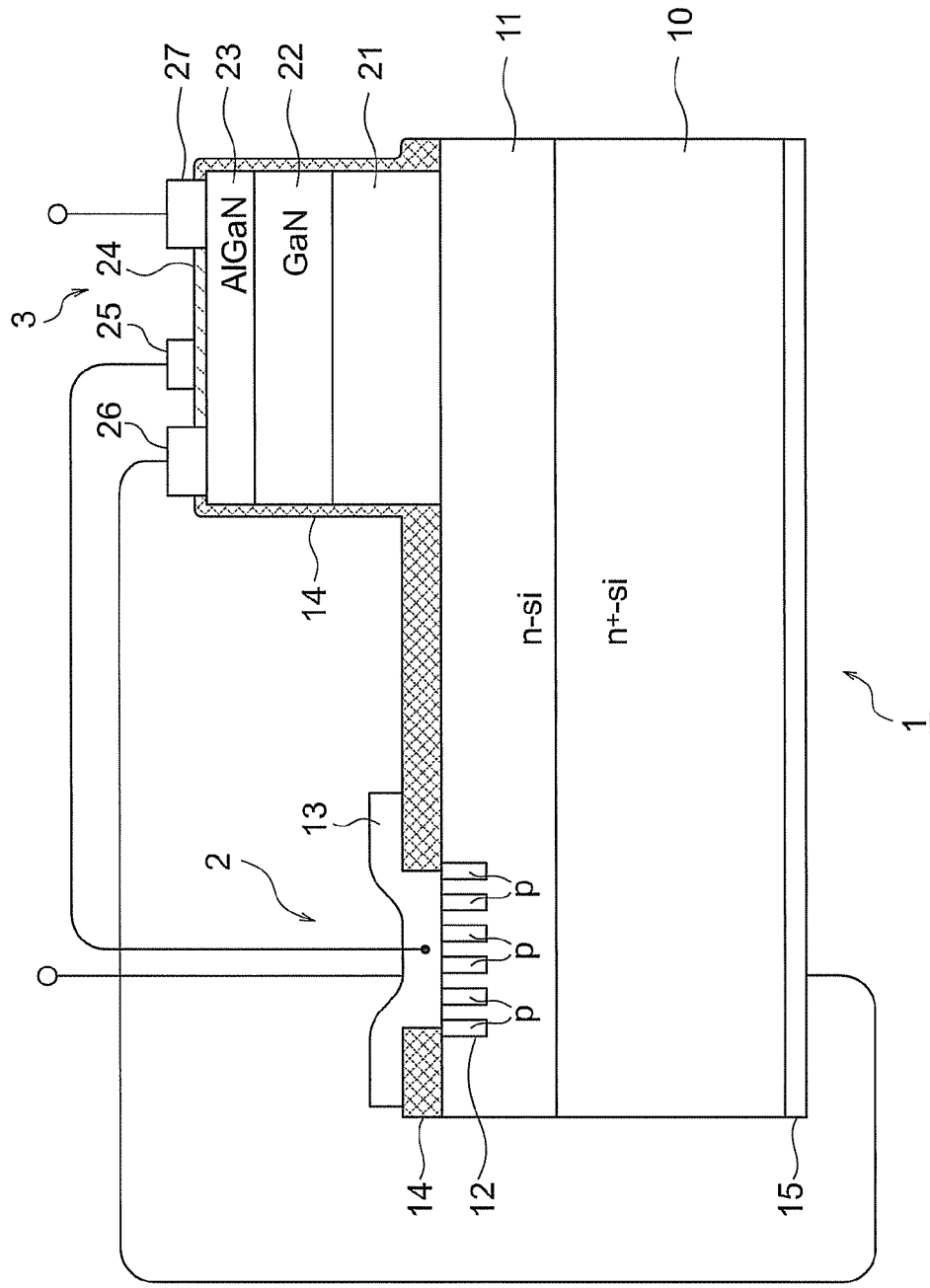

FIG. 9 is a diagram showing a cross section structure of the rectifier circuit 1 when the Schottky barrier diode 2 and GaN-FET 3 formed similarly to FIG. 8 are formed on the same silicon substrate.

Figure 10:
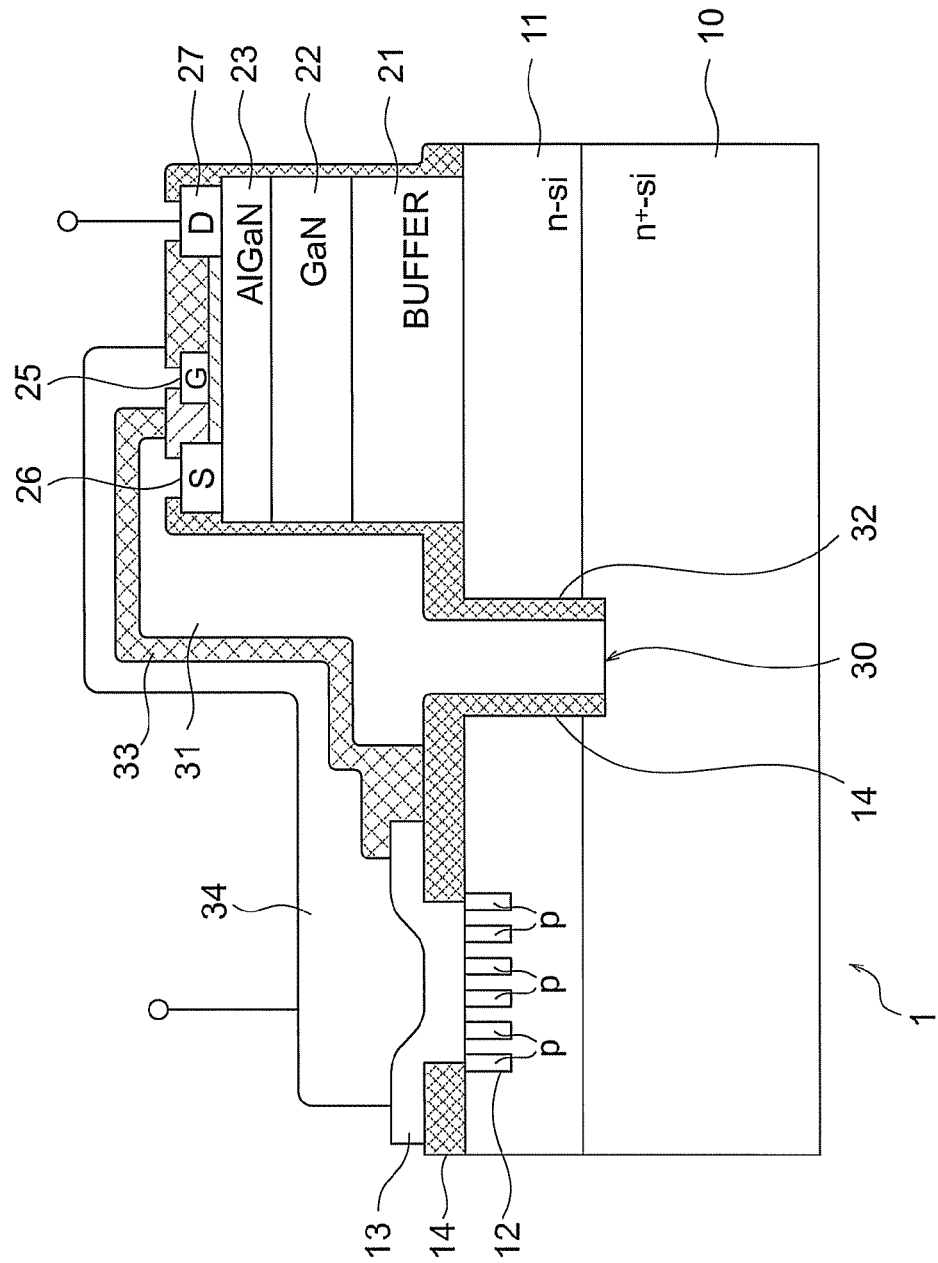

FIG. 10 is a diagram showing a cross section structure when the Schottky barrier diode 2 and the GaN-FET 3 are wired through a common metal layer, while omitting a wire bonding process.

Figure 11:
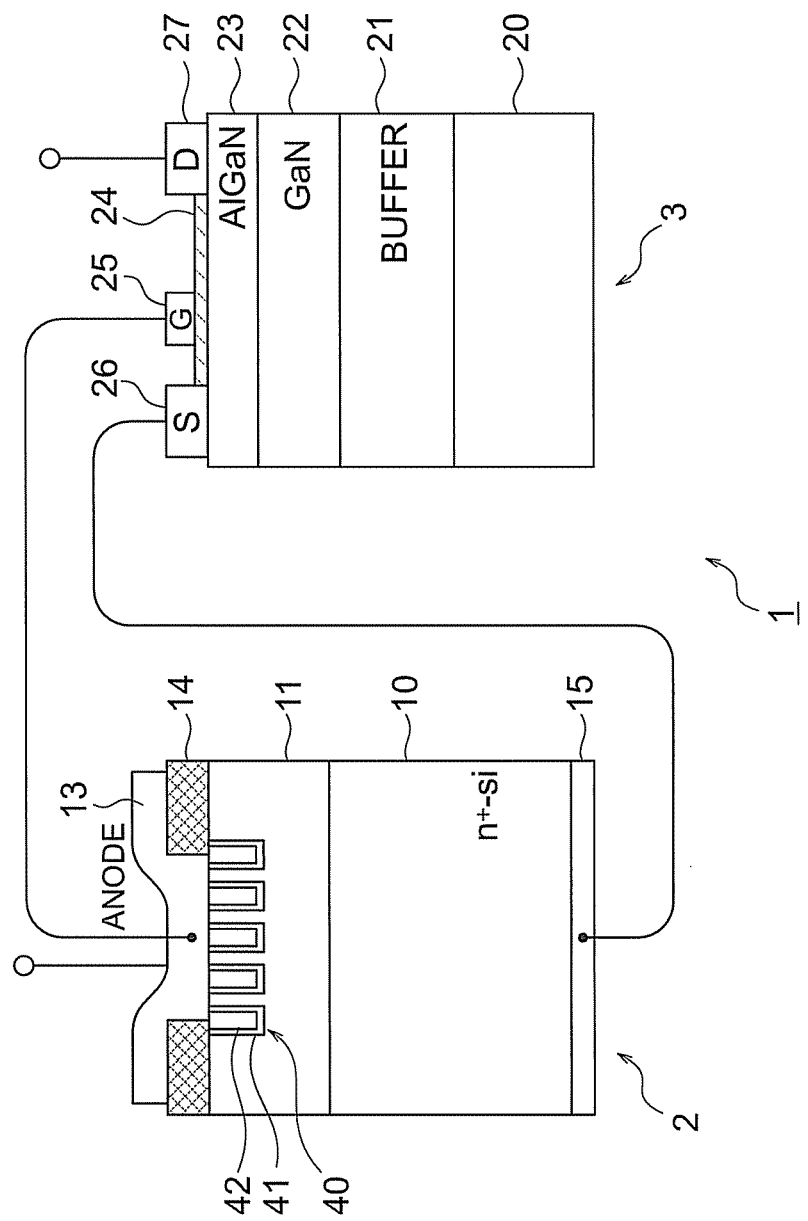

FIG. 11 is a sectional view of the rectifier circuit 1 when the Schottky barrier diode 2 to be used has a TMBS (Trench MOS Barrier Schottky) structure.

Each of FIGS. 12(a) to (c) is a diagram showing a cross section structure according to a modification example of the FET 3.

Figure 13:
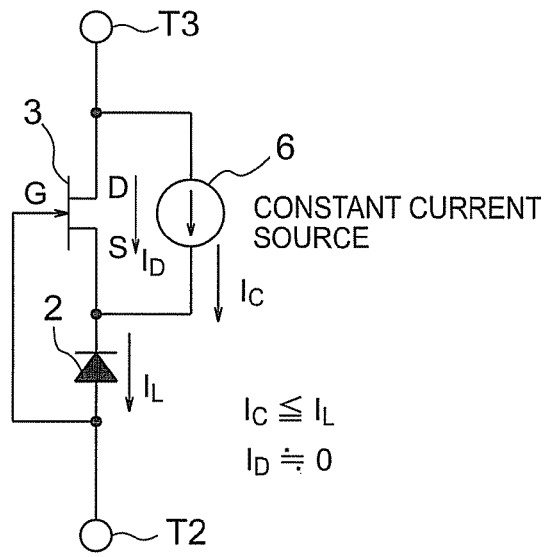

FIG. 13 is a circuit diagram of a rectifier circuit 1 according to a second embodiment.

Figure 14:
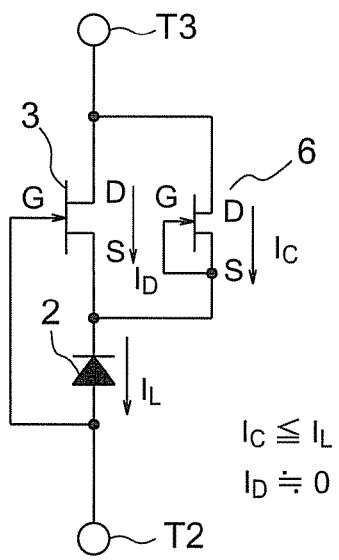

FIG. 14 is a circuit diagram of a rectifier circuit 1 showing an example with a constant current source 6 of FIG. 13 shown more concretely.

Figure 15:
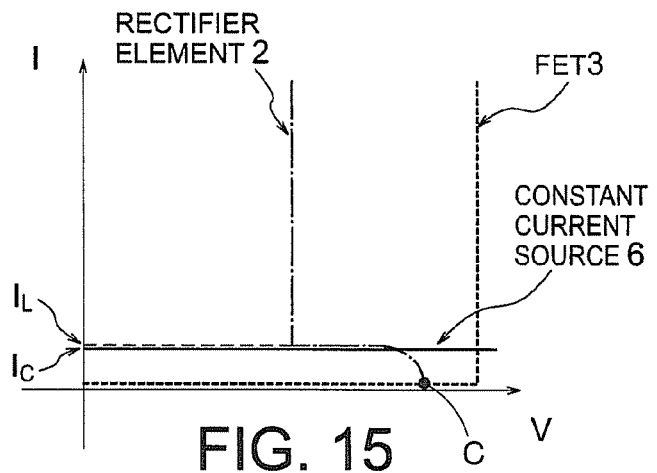

FIG. 15 is a diagram showing an operating point of the rectifier circuit 1 according to the second embodiment.

FIG. 16(a) is a cross section view showing a first concrete example of an FET 6 of FIG. 14 and FIG. 16(b) is a plan view thereof.

FIG. 17(a) is a cross section view showing a second concrete example of the FET 6 of FIG. 14 and FIG. 17(b) is a plan view thereof.

FIG. 18(a) is a cross section view showing a third concrete example of the FET 6 of FIG. 14 and FIG. 18(b) is a plan view thereof.

Figure 19:
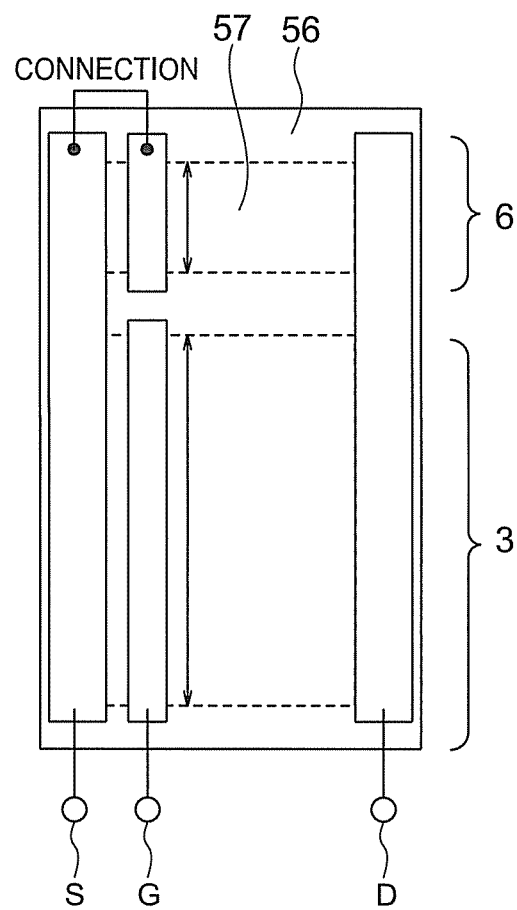

FIG. 19 is a plan view showing the layout of FETs 5 and 6 in the rectifier circuit 1 according to the present embodiment.

DETAILED DESCRIPTION

A rectifier circuit according to one embodiment has a rectifier element and a unipolar field-effect transistor connected in series between a first terminal and a second terminal. The rectifier element has a first electrode and a second electrode disposed in a direction of a forward current flowing from the first terminal to the second terminal. The field-effect transistor has a gate electrode having a potential identical to a potential at the first electrode, and a source electrode and a drain electrode connected in series to the rectifier element and passing a current depending on the potential at the gate electrode. A breakdown voltage between the gate electrode and drain electrode of the field-effect transistor in a reverse bias mode, where a potential at the second terminal is higher than a potential at the first terminal, is higher than a breakdown voltage of the rectifier element. In the rectifier element and the field-effect transistor, a first leakage current flowing through the rectifier element in the reverse bias mode is greater than a second leakage current flowing through the source electrode and drain electrode of the field-effect transistor when a voltage having a threshold value or less is applied between the gate electrode and source electrode of the field-effect transistor, and a relationship between the first leakage current and a voltage between the drain electrode and the source electrode falls within a safe operating area of the field-effect transistor.

Embodiments of the present invention will now be explained referring to the drawings.

First Embodiment

FIG. 1 is a circuit diagram of a rectifier circuit 1 according to a first embodiment. The rectifier circuit 1 of FIG. 1 has a rectifier element 2 and a unipolar field-effect transistor (hereinafter referred to as a FET 3) connected in series between two terminals T1 and T2. In the rectifier circuit 1 of FIG. 1, the direction from the terminal T1 to the terminal T2 is a forward bias direction, and the direction from the terminal T2 to the terminal T1 is a reverse bias direction.

The anode of the rectifier element 2 is connected to the terminal T1, and the cathode of the rectifier element 2 is connected to the source of the FET 3. The drain of the FET 3 is connected to the terminal T2, and the gate of the FET 3 is connected to the anode of the rectifier element 2 and to the terminal T1.

The FET 3 is a so-called normally-on type FET, in which current flows between the source and drain while no voltage is applied to the gate. As a concrete example of the FET 3, any type of the following can be applied, i.e. HEMT (High Electron Mobility Transistor), MES (Metal-Semiconductor) FET, MOSFET, SIT (Static Induction Transistor), etc.

Since high-speed performance is required for the FET 3, semiconductor layers in the FET 3 are made using a nitride semiconductor material, silicon carbide, or a semiconductor material having a larger band gap than silicon. In the present embodiment, explanation will be given mainly on an example where a HEMT having a GaN-containing semiconductor layer is used as the FET 3. The HEMT has no structural difference between the source and drain, and thus the direction of current flowing between the source and drain can be switched as needed. For convenience, in this specification, the electrode closer to the terminal T1 of the FET 3 is referred to as a source while the electrode closer to the terminal T2 of the FET 3 is referred to as a drain, regardless of the direction of current flowing between the source and drain of the FET 3.

The reason why e.g. GaN is used as a material of a semiconductor layer of the FET 3 according to the present embodiment is that GaN has a larger energy band and a higher carrier mobility than silicon and is less expensive than silicon carbide.

It is desirable that the rectifier element 2 has a small junction capacitance and passes a lower leakage current. Further, it is desirable that silicon, which is an inexpensive material, is used as a base material of the rectifier element 2. Accordingly, silicon Schottky barrier diode, silicon P-N junction diode, silicon PIN diode, etc. are desirable. In the present embodiment, explanation will be given mainly on an example of using a silicon Schottky barrier diode (SBD). The reason for using a Schottky barrier diode is that delay in reverse recovery time is not theoretically caused by the accumulation of minority carriers.

Next, operation of the rectifier circuit 1 according to the present embodiment will be explained. When the rectifier circuit 1 of FIG. 1 is in a forward bias mode, the voltage at the terminal T1 becomes higher than the voltage at the terminal T2, forward current flows between the anode and cathode of the rectifier element 2, and the voltage between the anode and cathode is clipped at a forward voltage Vf. Further, since the voltage applied to the gate of the FET 3 is higher than that of the source by Vf, the FET 3 is turned on and current flows between the source and drain.

Accordingly, when the rectifier circuit 1 of FIG. 1 is in the forward bias mode, current flows from the terminal T1 to the terminal T2, and the amount of current flow depends on the current flowing between the source and drain of the FET 3.

On the other hand, when the rectifier circuit 1 of FIG. 1 is in a reverse bias mode, the cathode of the rectifier element 2 has a higher potential than the anode, and thus the source of the FET 3 has a higher potential than the gate and the FET 3 is directed to be turned off. However, in the reverse bias mode, leakage current flows from the cathode to anode of the rectifier element 2. This leakage current increases the gate voltage of the FET 3 and leakage current flows from the drain to source of the FET 3, and thus the FET 3 is feedback-controlled to be kept slightly turned on.

It is desirable that the leakage current flowing through the rectifier circuit 1 of FIG. 1 in the reverse bias mode is as lower as possible. Accordingly, the rectifier element 2 is required to pass lower leakage current in the reverse bias mode.

FIG. 2 is a diagram showing voltage-current characteristics when using a GaN-FET as the FET 3 in the rectifier circuit 1 of FIG. 1 and using a silicon Schottky barrier diode as the rectifier element 2. In FIG. 2, "V" represents the voltage between the terminals T1 and T2, "VDS" represents the voltage between the source and drain of the FET 3, "VDi(=VR)" represents the voltage between the anode and cathode of the Schottky barrier diode, "IG" represents the gate current of the FET 3, "ID" represents the current flowing from the terminal T2 to the drain of the FET 3, and "IR" represents the leakage current flowing from the cathode to anode of the Schottky barrier diode.

FIG. 2(a) is a graph showing VDS-ID characteristics of the GaN-FET 3. As shown in FIG. 2(a), the drain current ID becomes lower as the reverse bias voltage V between the terminals T2 and T1 becomes higher. Note that "Vt" shown in FIG. 2(a) represents the voltage between the terminals T2 and T1 of FIG. 1.

FIG. 2(b) is a graph showing VR-IR characteristics of the Schottky barrier diode. As shown in FIG. 2(b), when the reverse direction VR reaches a voltage VB, breakdown is caused and the reverse current IR rapidly increases.

FIG. 2(c) is a characteristic graph when replacing the horizontal axis of FIG. 2(b) with VDS (=V−VDi). The characteristic curve of FIG. 2(c) has a shape which is obtained by reversing the characteristic curve of FIG. 2(b) using the Y-axis (vertical axis) as the axis of symmetry.

FIG. 3(a) is a diagram showing the superposition of the characteristic curve of the FET 3 shown in FIG. 2(a) on the characteristic curve of the rectifier element 2 shown in FIG. 2(c). An intersection "c" of these two characteristic curves shows the operating point of the rectifier circuit 1 of FIG. 1.

When the characteristic curve of the FET 3 is shifted in the positive direction of the Y-axis (vertical axis) due to, e.g., manufacturing variability of the FET 3, the operating point c is shifted to the position as shown in FIG. 3(b). The operating point in FIG. 3(b) shows that the leakage current flowing through the FET 3 is higher than the reverse leakage current flowing through the rectifier element 2. In this case, there is a likelihood that a high voltage exceeding a breakdown voltage is applied between the anode and cathode of the rectifier element 2 and thus the rectifier element 2 is broken.

In order to prevent the rectifier element 2 from such a breakdown, when the rectifier circuit 1 of FIG. 1 is in the reverse bias mode, the leakage current flowing through the FET 3 should be made lower than the leakage current flowing through the rectifier element 2. When the leakage current flowing through the FET 3 is lower than the leakage current flowing through the rectifier element 2, leakage current exceeding the breakdown current of the rectifier element 2 does not flow through the FET 3, which means that voltage exceeding the breakdown voltage is not applied between the anode and cathode of the rectifier element 2 and the rectifier element 2 can be prevented from breakdown.

Further, the relationship between the leakage current flowing through the FET 3 and the voltage between the drain and source thereof should be within a safe operating area (SOA) of the FET 3. This is because the FET 3 may possibly be broken when the amount of leakage current flowing through the FET 3 is beyond the safe operating area (SOA) of the FET 3.

In summary, the rectifier circuit 1 of FIG. 1 is stably operated on direct current when the following conditions 1) and 2) are satisfied. Both of the two conditions are essential.

1) The leakage current flowing between the source and drain of the FET 3 is lower than the leakage current flowing through the rectifier element 2. More concretely, the leakage current flowing through the rectifier element 2 is higher than the leakage current flowing between the source and drain of the FET 3 when a voltage having a threshold value or less is applied between the gate and source of the FET 3.

2) At the operating point of the rectifier circuit 1 of FIG. 1, the relationship between the leakage current flowing through the FET 3 and the voltage between the drain and source thereof is within the safe operating area (SOA) of the FET 3.

Naturally, in addition to the above conditions 1) and 2), the breakdown voltage (e.g., 30V) of the rectifier element 2 in the reverse bias mode should be set lower than the voltage between the gate and drain of the FET 3. This is because that the rectifier circuit 1 cannot have a breakdown voltage higher than that of a single rectifier element 2 when the breakdown voltage of the rectifier element 2 is higher than the voltage between the gate and drain of the FET 3.

On the other hand, it is desirable that the breakdown voltage between the gate and source of the FET 3 is higher than the breakdown voltage of the rectifier element 2 in the reverse bias mode. This is because the FET 3 can be protected by clamping the voltage between the gate and source of the FET 3 at the reverse breakdown voltage of the rectifier element 2 if surge voltage etc. is applied between the gate and source of the FET 3. Note that this condition is not necessarily essential under an environment having less noise.

When incorporating the rectifier circuit 1 of FIG. 1 into a power-supply circuit, the rectifier circuit 1 of FIG. 1 alternately repeats forward bias operation and reverse bias operation. The rectifier circuit 1 of FIG. 1 when performing such an alternating current operation (dynamic operation) can be stably operated if the following conditions 3) and 4) are satisfied. Both of these conditions 3) and 4) are essential.

3) The junction capacitance of the rectifier element 2 is completely charged while the reverse bias mode is applied.

4) The FET 3 operates within the safe operating area (SOA) while the junction capacitance of the rectifier element 2 is charged.

Figure 5:
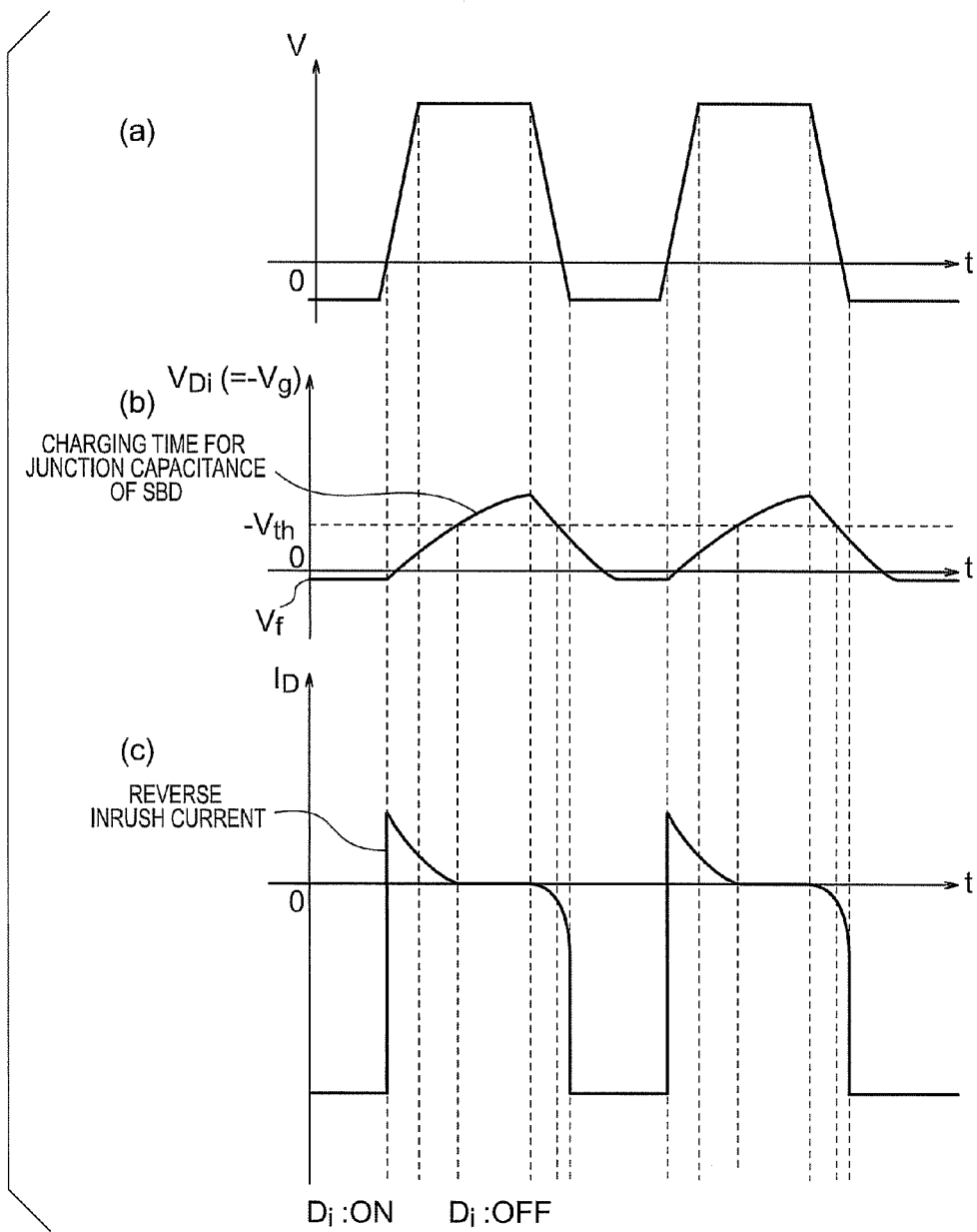

Hereinafter, these conditions 3) and 4) will be explained. FIG. 4 is a circuit diagram when an alternating-current voltage source 4 is connected to the terminals T1 and T2 of the rectifier circuit 1 of FIG. 1, and each of FIGS. 5(*a*) to (*c*) is a waveform diagram of each area of the rectifier circuit 1 of FIG. 1 when the alternating-current voltage source of FIG. 4 is connected. FIG. 5(*a*) shows a waveform of voltage "V" between the terminals T1 and T2, FIG. 5(*b*) shows a waveform of voltage "VDi" between the anode and cathode of the rectifier element 2, and FIG. 5(*c*) shows a waveform of current "ID" flowing through the rectifier element 2.

In FIG. 5(*a*), a positive pulse shows that the rectifier circuit 1 of FIG. 1 is in the reverse bias mode. When the rectifier circuit 1 switches from the forward bias mode to the reverse bias mode, the voltage between the anode and cathode of the rectifier element 2 gradually rises to charge the junction capacitance of the rectifier element 2. Further, as soon as the rectifier circuit 1 switches from the forward bias mode to the reverse bias mode, charges are accumulated in the junction capacitance and reverse inrush current flows from the cathode to anode of the rectifier element 2.

If the junction capacitance of the rectifier element 2 is not completely charged while the rectifier circuit 1 is in the reverse bias mode, the rectifier element 2 cannot operate corresponding to the operating frequency of forward bias operation and reverse bias operation alternately repeated. Thus, the above condition 3) is essential. Further, immediately after the rectifier circuit 1 switches from the forward bias mode to the reverse bias mode, reverse inrush current flows as shown in FIG. 5(*c*). Since this inrush current also flows between the drain and source of the FET 3, it is required to prevent a current beyond the safe operating area (SOA) of the FET 3 from flowing through the FET 3. Accordingly, the above 4) condition is also essential.

FIG. 6 is a diagram showing an example of a safe operating area (SOA) when using a GaN-FET as the FET 3. In order to stably operate the FET 3, it is essential that the operating point of the FET 3 is situated within the safe operating area (SOA) enclosed by broken lines. FIG. 6 shows a safe operating area SOA 1 of the FET 3 operated on direct current, and a safe operating area SOA 2 of the FET 3 receiving a single pulse. It is desirable to arrange the operating point within the safe operating area SOA 1, which is based on severer conditions than the safe operating area SOA 2. In FIG. 6, a plot "op" shows an example of operating point situated beyond the safe operating area. In this example, operation of the FET 3 cannot be guaranteed and the FET 3 may possibly be broken.

The safe operating area (SOA) is determined based on parameters of the FET 3, such as rated current, rated voltage, operating temperature, etc. Therefore, it is required to detect a safe operating area (SOA) of the FET 3 based on these parameters in order to set element parameters of the FET 3 and rectifier element 2 so that the operating point of the FET 3 is situated within the detected safe operating area (SOA).

As stated above, the rectifier circuit 1 of FIG. 1 is required to satisfy both of the conditions 1) and 2) when being operated on direct current, and to satisfy both of the conditions 3) and 4) when being operated on alternating current.

Figure 7:
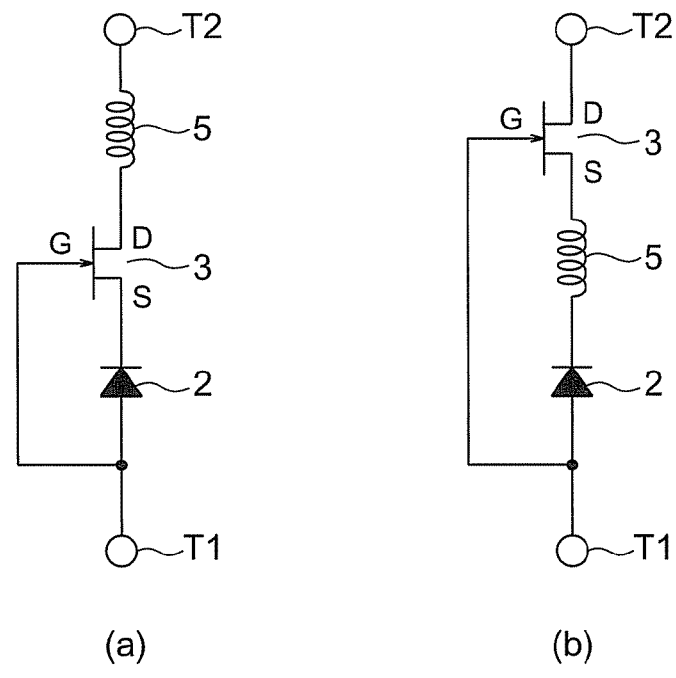

The condition 4) is provided to prevent a leakage current beyond the safe operating area (SOA) from flowing through the FET 3 when the rectifier circuit 1 of FIG. 1 is in the reverse bias mode and inrush current flows through the junction capacitance of the rectifier element 2. As one way to satisfy this condition, it is effective to connect an inductor element 5 between the terminal T2 and the drain of the FET 3 in the rectifier circuit 1 of FIG. 1 as shown in FIG. 7(*a*), or to connect the inductor element 5 between the source of the FET 3 and the cathode of the rectifier element 2 as shown in FIG. 7(*b*).

By connecting the inductor element 5 to the drain or source of the FET 3, current hardly flows between the drain and source of the FET 3, thereby inrush current being restrained. Note that the possibility of causing parasitic oscillations is increased when connecting the inductor element 5. Thus, L value of the inductor element 5 should be optimized to prevent parasitic oscillations.

As stated above, the combination of elements concretely used as the FET 3 and rectifier element 2 in the rectifier circuit 1 of FIG. 1 should not be necessarily fixed, and various combinations can be assumed. Further, the FET 3 and rectifier element 2 in the rectifier circuit 1 of FIG. 1 may be formed on the same semiconductor substrate, or may be formed as discrete parts mounted on, e.g., a printed board.

FIG. 8 is a sectional view of the rectifier circuit 1 when the rectifier element 2 functioning as a Schottky barrier diode having a JBS (Junction Barrier Schottky) structure and the FET 3 functioning as a MIS-type GaN-FET are discrete parts.

The Schottky barrier diode 2 of FIG. 8 has an n-type silicon layer 11 formed on an $n^+$-type silicon substrate 10, a plurality of p-type surface layers 12 formed at predetermined intervals on the surface of the n-type silicon layer 11, an anode electrode layer 13 made of a metal material and in Schottky contact with the n-type silicon layer 11, an insulating layer 14 formed around the anode electrode layer 13, and a cathode electrode layer 15 formed on the opposite side of the $n^+$-type silicon substrate 10 from the anode electrode layer 13.

The GaN-FET 3 of FIG. 8 has a buffer layer 21 formed on a substrate 20, GaN layer 22 formed on the buffer layer 21, an AlGaN layer 23 formed on the GaN layer 22, a gate electrode layer 25 formed on the AlGaN layer 23 with an insulating film 24 therebetween, and a source electrode layer 26 and a drain electrode layer 27 formed on the AlGaN layer 23 and close to the gate electrode layer 25.

The substrate 20 is made of a material such as silicon, sapphire and GaN. The buffer layer 21 is made of a material having an AlGaN/GaN superlattice heterostructure, for example.

The anode electrode layer 13 of the Schottky barrier diode 2 of FIG. 8 is connected to the gate electrode layer 25 of the GaN-FET 3 through a wiring pattern etc., and the cathode electrode layer 15 of the Schottky barrier diode 2 is connected to the source electrode layer 26 of the GaN-FET 3 through a wiring pattern etc.

When the Schottky barrier diode 2 of FIG. 8 is in the reverse bias mode, a depletion layer extends between the p-type surface layers 12 adjacent to each other and can easily pinch off the channel. Accordingly, the junction capacitance of the Schottky barrier diode 2 can be made smaller while restraining leakage current.

FIG. 9 is a diagram showing a cross section structure of the rectifier circuit 1 when the Schottky barrier diode 2 and GaN-FET 3 formed similarly to FIG. 8 are formed on the same silicon substrate. The rectifier circuit 1 of FIG. 9 has the $n^+$-type silicon substrate 10, and the n-type silicon layer 11 formed on this substrate 10. On the surface of the n-type silicon layer 11, the buffer layer 21 for the GaN-FET 3 is formed together with the p-type surface layers 12 for the Schottky barrier diode 2 disposed at regular intervals.

Further, the oxide film 14 formed on the n-type silicon layer 11 is in contact with the anode electrode layer 13 for the Schottky barrier diode 2, and covers the sidewalls of compound semiconductor layers 21 to 23 of the GaN-FET 3.

The rectifier circuit 1 of FIG. 9 can be made as a chip. In this case, it is required to connect the anode electrode layer 13 of the Schottky barrier diode 2 and the gate electrode layer 25 of the GaN-FET 3 through wire bonding, and to connect the cathode electrode layer 15 of the Schottky barrier diode 2 and the source electrode layer 26 of the GaN-FET 3 through wire bonding.

On the other hand, in the rectifier circuit 1 of FIG. 10, the Schottky barrier diode 2 and the GaN-FET 3 are wired through a common metal layer, while omitting a wire bonding process.

The Schottky barrier diode 2 and GaN-FET 3 in the rectifier circuit 1 of FIG. 10 are basically the same in structure as those shown in FIG. 8 and FIG. 9, but different in the arrangement and shape of the wiring layer (electrode layer) and oxidized layer (insulating layer 14).

More concretely, in the rectifier circuit 1 of FIG. 8 and FIG. 9, the cathode electrode layer 15 is disposed on the opposite side of the $n^+$-type silicon substrate 10 from the anode electrode layer 13. On the other hand, in the rectifier circuit 1 of FIG. 10, the cathode electrode layer is disposed on the same side as the anode electrode layer 13. This arrangement is realized by forming a contact hole 30 in the n-type silicon layer 11 on the $n^+$-type silicon substrate 10 and forming, in the contact hole 30, a first wiring layer 31 functioning as a cathode electrode layer. On the sidewalls of the contact hole 30, the oxidized layer 14 for the Schottky barrier diode 2 is provided separately from an insulating film 32 for covering the sidewalls of the compound semiconductor layers of the GaN-FET 3.

The first wiring layer 31, which is in contact with the $n^+$-type silicon substrate 10 through the contact hole 30, is used as a cathode electrode layer of the Schottky barrier diode 2 while functioning as a source electrode layer of the GaN-FET 3.

An interlayer insulating film 33 is formed on the first wiring layer 31, and a second wiring layer 34 is formed on the interlayer insulating film 33. The second wiring layer 34 is connected to the anode electrode layer 13 of the Schottky barrier diode 2 and to the gate of the GaN-FET 3.

As stated above, the rectifier circuit 1 of FIG. 10 has the first wiring layer 31 and the second wiring layer 34 each connected to both of the Schottky barrier diode 2 and the GaN-FET 3, which makes it possible to omit the wire bonding process and simplify the process of making the rectifier circuit 1 as a semiconductor chip.

In FIGS. 8 to 10, an example using the Schottky barrier diode 2 of a JBS structure has been described. FIG. 11 to be explained below is a sectional view of the rectifier circuit 1 using the Schottky barrier diode 2 of TMBS (Trench MOS Barrier Schottky) structure. The cross section structure of the GaN-FET 3 of FIG. 11 is similar to the FET 3 of FIGS. 8 to 10. The Schottky barrier diode 2 of FIG. 11 is different from FIG. 8 in that electrode layers 42 are formed in trenches 40 disposed at regular intervals on the surface of the n-type silicon layer 10 through insulating layers 41. When the Schottky barrier diode 2 has a TMBS structure, electric field intensity in the Schottky junction between the n-type silicon layer 10 and the anode electrode layer 13 can be reduced, which makes it possible to restrain leakage current when the Schottky barrier diode 2 is in the reverse bias mode. Further, since a depletion layer can easily extend, junction capacitance can be made smaller.

As stated above, in order to stably operate the rectifier circuit 1 of FIG. 1, it is required to satisfy the above conditions 1) and 2) in direct current operation, and to satisfy the above conditions 3) and 4 in alternating current operation. To satisfy these conditions, it is desirable that the leakage current flowing through the rectifier element 2 in the reverse bias mode is as low as possible but higher than the leakage current flowing between the drain and source of the FET 3 when a voltage having a threshold voltage or less is applied between the gate and source of the FET 3. More concretely, e.g., a leakage current of several μ amperes or less is desirable. Accordingly, the Schottky barrier diode 2 having a JBS structure or a TMBS structure is effective.

Further, it is desirable that the junction capacitance of the rectifier element 2 is as small as possible. More concretely, e.g., a junction capacitance of 100 pF or less is desirable. However, when element area is reduced to decrease the junction capacitance, ON-resistance is increased and loss of circuit is increased. Therefore, the Schottky barrier diode 2 having a MS structure or a TMBS structure realizing the reduction in junction capacitance is effective against on-resistance.

Further, it is also desirable that the leakage current flowing between the drain and source of the FET 3 is as low as possible. The leakage current can be restrained by forming, in the FET 3 shown in FIGS. 8 to 10, an AlGaN layer to block leakage current, or by implanting impurity ions into the buffer layer to increase resistance.

Figure 12:
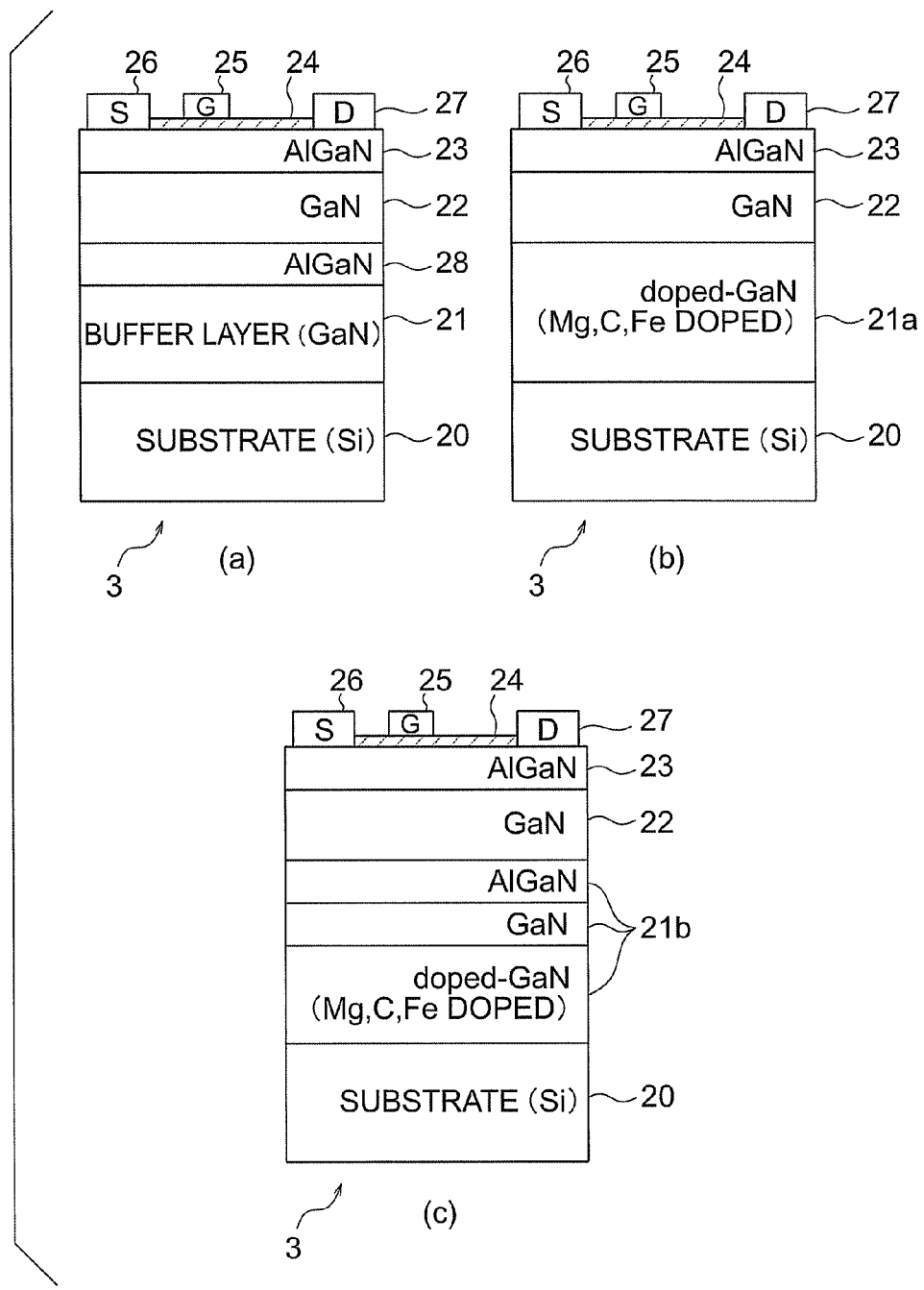

For example, FIG. 12(*a*) is a sectional view when an AlGaN layer 28 is inserted between the buffer layer 21 and GaN layer 22 in the FET 3 shown in FIGS. 8 to 10. In this FET 3, the AlGaN layer 28, the GaN layer 22, and the AlGaN layer 23 constitute an AlGaN/GaN/AlGaN double heterostructure. Since the AlGaN layer 28 newly inserted blocks leakage current, the leakage current flowing between the drain and source can be restrained.

FIG. 12(*b*) is a sectional view of the FET 3 having a GaN layer 21*a* obtained by implanting Mg, C, Fe, etc. into non-doped n-type GaN in order to make the buffer layer 21 in the FET 3 shown in FIGS. 8 to 10 to compensate conduction carriers, or to increase resistance by generating a deeper level by the implanted dopant.

Further, a modification example of FIG. 12(*b*) is shown in FIG. 12(*c*), which is a sectional view when the FET 3 has an AlGaN/GaN/doped-GaN heterostructure layer 21*b* instead of the buffer layer 21.

The cross section structure of any one of FIG. 12(*a*) to FIG. 12(*c*) can be applied to the FET 3 shown in FIGS. 8 to 10.

As stated above, in the present embodiment, when the rectifier circuit 1 is formed to have the rectifier element 2 and the FET 3 connected in series, the rectifier element 2 and the FET 3 are designed so that the above conditions 1) and 2) are satisfied in direct current operation, and so that the above conditions 3) and 4) are satisfied in alternating current operation. This makes it possible to prevent an excessive voltage from being applied between the anode and cathode of the rectifier element 2 in the reverse bias mode, and to prevent the FET 3 from being operated beyond its safe operating area (SOA). Correspondingly, the rectifier element 2 and the FET 3 are hardly broken, and the junction capacitance of the rectifier element 2 can be charged at higher speed. Therefore, the rectifier circuit 1 produced according to the present embodiment can achieve short reverse recovery time, high voltage resistance, and excellent durability.

Particularly, in the first embodiment, the rectifier circuit 1 is formed by using a semiconductor material (e.g., GaN) less expensive than silicon carbide in the FET 3 and using silicon in the rectifier element 2 (e.g., silicon Schottky diode). Accordingly, component cost can be considerably reduced compared to the case where the rectifier circuit 1 is formed using an expensive semiconductor material such as silicon carbide. Further, the rectifier circuit 1 according to the present embodiment is not inferior to a rectifier circuit formed using silicon carbide in terms of electric characteristics such as reverse recovery time, voltage resistance, and durability.

Second Embodiment

A second embodiment to be explained below is to further stabilize the operations of the rectifier element 2 and FET 3.

In the rectifier circuit 1 of FIG. 1, in the reverse bias mode, a reverse leakage current flows through the rectifier element 2 to cause the gate voltage of the FET 3 to reach near the threshold voltage, so that the FET 3 operates in a weak ON state. Therefore, while a high voltage is applied between the drain and source of the FET 3, leakage current flows between the drain and source, as shown in FIG. 2(*a*).

For the reason above, as shown in FIG. 3, the operating point of the voltages to be applied between the drain and source of the FET 3 and to the rectifier element 2 originally tends to be unstable. When the operating point is shifted, as shown in FIG. 3, there is a likelihood that an excessive voltage is applied to the rectifier element 2 as shown in FIG. 3(*b*) and thus the rectifier element 2 is broken down. This leads to an excessive current flowing through the FET 3 to the extent that it exceeds the safe operating area to break down the FET 3, etc.

In order to avoid the malfunctions discussed above, the first embodiment described above has explained an example in which the rectifier element 2 and FET 3 are designed so that the conditions 1) and 2) described above are satisfied in a direct current operation and the conditions 3) and 4) described above are satisfied in an alternating current operation.

In contrast to the first embodiment, the following second embodiment is to satisfy the above conditions 1) to 4) according to characteristics in circuit configuration.

FIG. 13 is a circuit diagram of a rectifier circuit 1 according to a second embodiment. The rectifier circuit 1 of FIG. 13 has a configuration in which a constant current source 6 is added to the rectifier circuit 1 of FIG. 1. This rectifier circuit 1 is connected between the drain and source of the FET 3 in parallel.

FIG. 14 is a circuit diagram of a rectifier circuit 1, showing an example in which the constant current source 6 of FIG. 13 is specified more concretely. The constant current source 6 of FIG. 14 is configured to have the gate of a normally-on type FET 6 connected to the source thereof. Or the constant current source 6 may be a normally-on type FET in which a portion of the channel is contracted. In the present embodiment, a current flowing through the constant current source 6, namely, a current flowing between the drain and source of the FET 6, is set to a value as close as possible to the value of a leakage current to the extent that the current does not exceed the leakage current of the rectifier element 2. Moreover, a break-down voltage between the gate and drain of the FET 6 corresponding to the constant current source 6 is set to a value equal to or higher than that of the FET 3.

In the rectifier circuit 1 of FIG. 13, in the reverse bias mode, a leakage current flowing through the rectifier element 2 is supplied from the constant current source 6, hence the FET 3 is almost in an off state. Therefore, there is no likelihood that the operation of the FET 3 is deviated from the safe operating area.

Moreover, since the current value of the constant current source 6 is constant, there is no likelihood of shift of the operating point, hence the brake-down of the rectifier element 2 due to the shift of the operating point is prevented.

FIG. 15 is a diagram showing an operating point of the rectifier circuit 1 according to the present embodiment. As shown, the current value of the constant current source 6 is always constant so that the operating point corresponding to a cross point of the FET 3 and the rectifier element 2 does not vary.

In FIGS. 13 and 14, one terminal of the constant current source 6 is connected to the drain of the FET 3. However, one terminal of the constant current source 6 may not necessarily be connected to the drain of the FET 3. For example, this terminal may be set at a specific voltage.

Figure 16:
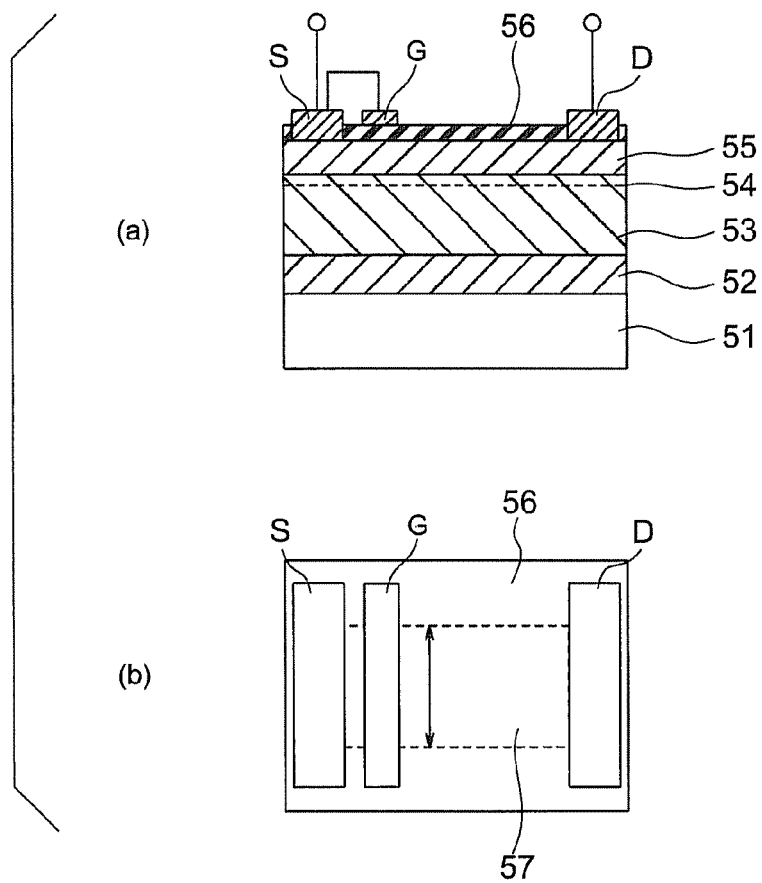

FIG. 16 is a diagram showing a first concrete example of an FET 6 of FIG. 14, in which FIGS. 16(*a*) and 16(*b*) are a cross section and a plan view, respectively. An FET 6 of FIG. 16 is a normally-on type GaN-HEMT. The FET 6 has a structure in which a buffer layer 52, a GaN layer 53, a two-dimensional electron gas layer 54, and an AlGaN layer 55 are stacked in this order on a substrate 51 made of silicon, sapphire, GaN, etc. On the AlGaN layer 55, an insulating film 56, a gate G, a source S, and a drain D are laminated. By electrically connecting the gate G and source S formed on the AlGaN layer 55 to each other, the FET 6 shows a characteristic in which a drain current of the FET 6 is saturated irrespective of a drain voltage thereof, hence the FET 6 operates as the constant current source 6.

The value of the drain current of the FET 6 corresponding to the constant current of the constant current source 6 is controllable by adjusting the channel width. The channel width is adjustable with the amount of doping of impurity ions to a channel 57, etching, etc.

Instead of GaN-HEMT, the FET 6 may be GaN-MOSFET, SiC-JFET, Si-JFET, etc.

Figure 17:
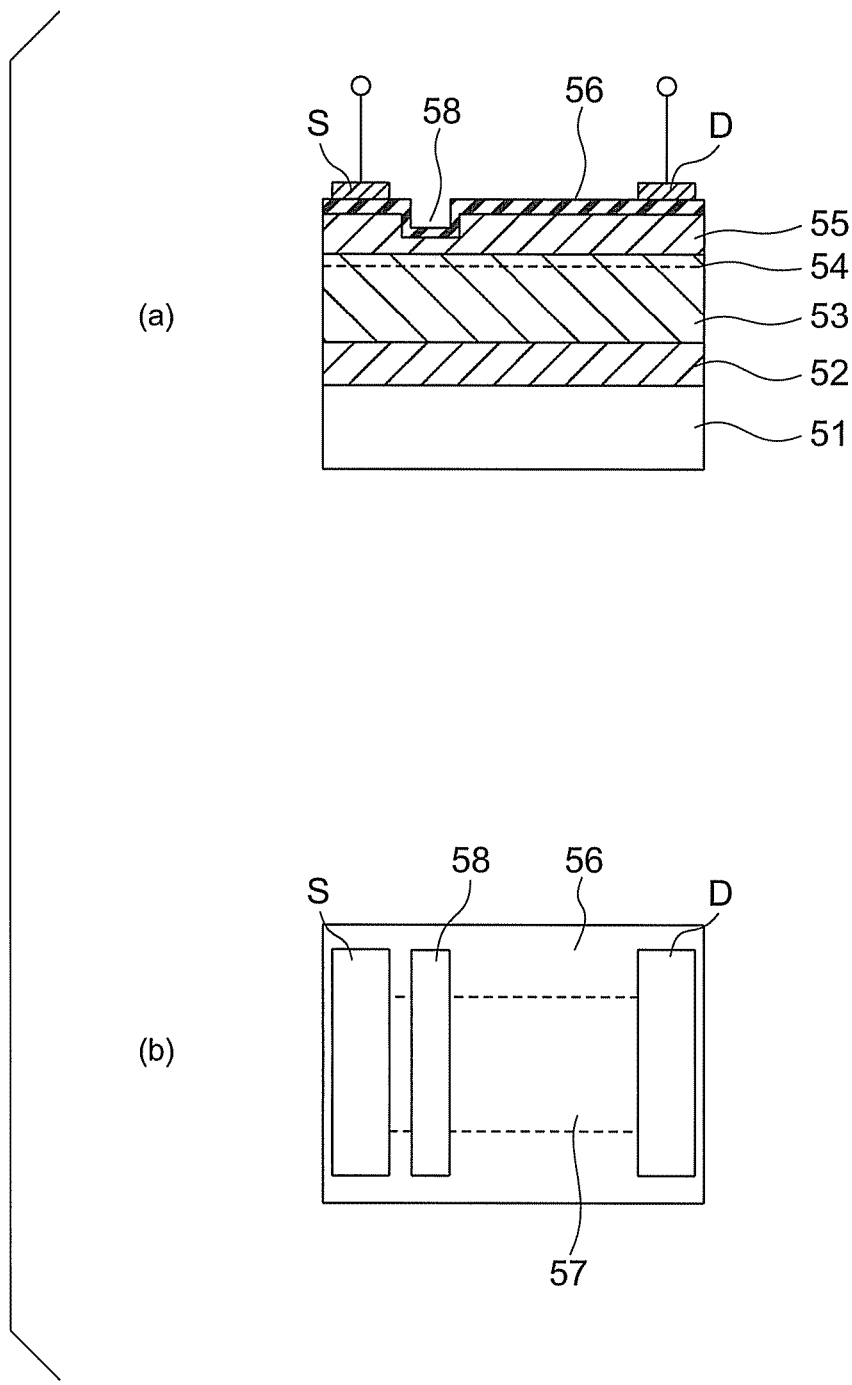

FIG. 17 is a diagram showing a second concrete example of the FET 6 of FIG. 14, in which FIGS. 17(*a*) and 17(*b*) are a cross section and a plan view, respectively. An FET 6 of FIG. 17 is different from FIG. 16 concerning the structure of an AlGaN layer 55 but similar to FIG. 16 concerning the layered structure under the AlGaN layer 55.

A portion of the AlGaN layer 55 of FIG. 17 has a recessed portion 58 formed by recess etching in the width direction. By means of the recessed portion 58, the density of a two-dimensional electron gas layer 54 is controlled. By adjusting the size or shape of the recessed portion 58, a drain current of the FET 6 that corresponds to the constant current of the constant current source 6 can be controlled. The recessed portion 58 may be etched until it completely penetrates into the AlGaN layer 55 or may be etched so as not to penetrate thereinto. Not only by varying the etching amount of the AlGaN layer 55, but also the drain current of the FET 6 can be adjusted by varying the film thickness of an insulating film 56 formed on the AlGaN layer 55. In the example of FIG. 17, the gate for the FET 6 may be or may not be formed.

Figure 18:
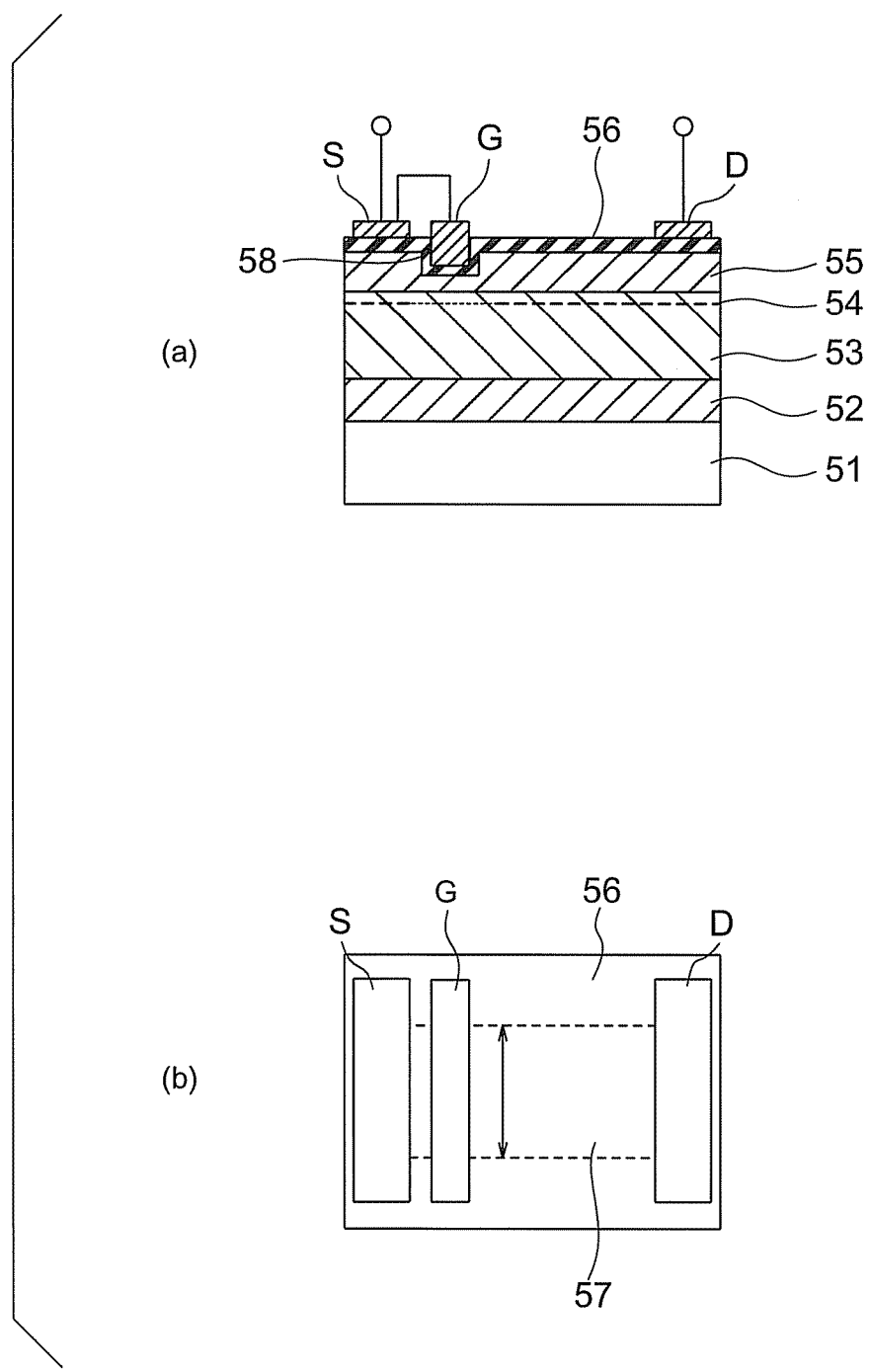

FIG. 18 is a diagram showing a third concrete example of the FET 6 of FIG. 14, in which FIGS. 18(*a*) and 18(*b*) are a cross section and a plan view, respectively. An FET 6 of FIG. 18 has a structure that is a combination of the first and second concrete examples described above. Namely, in the FET 6 of FIG. 18, a gate G is formed on a recessed portion 58 formed in a portion of an AlGaN layer 55. In the FET 6 of FIG. 18, by adjusting the size or shape of the recessed portion 58 formed in the AlGaN layer 55, the drain current of the FET 6 that corresponds to the constant current of the constant current source 6 can be controlled.

A gate is not essential for the FET 6 according to the second concrete example of FIG. 17. On the other hand, it is essential for the FET 6 of FIG. 18. The gate is formed on the recessed portion 58 formed in the AlGaN layer 55 through an insulating film 56.

FIG. 19 is a plan view showing the layout of FETs 3 and 6 in the rectifier circuit 1 according to the present embodiment. The FET 6 in this figure may be any one of the first to third complete examples described above. As shown, the FETs 3 and 6 are formed as being aligned in one direction. By way of this alignment, the FETs 3 and 6 can share a source and also a drain, hence can be formed in a small layout area.

As described above, in the second embodiment, the constant current source 6 is newly added to the rectifier circuit 1 according to the first embodiment in order to supply most of a leakage current flowing through the rectifier element 2 in the reverse bias mode. Therefore, the operating point is not shifted, so that breakdown of the FET 3 and the rectifier element 2 can be prevented more surely.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A rectifier circuit comprising:
a rectifier element and a unipolar field-effect transistor connected in series between a first terminal and a second terminal,
wherein the rectifier element comprises a first electrode and a second electrode disposed in a direction of a forward current flowing from the first terminal to the second terminal,
the field-effect transistor comprises:
a gate electrode having a potential identical to a potential at the first electrode; and
a source electrode and a drain electrode connected in series to the rectifier element and passing a current depending on the potential at the gate electrode,
a breakdown voltage between the gate electrode and drain electrode of the field-effect transistor in a reverse bias mode, where a potential at the second terminal is higher than a potential at the first terminal, being higher than a breakdown voltage of the rectifier element, and
in the rectifier element and the field-effect transistor, a first leakage current flowing through the rectifier element in the reverse bias mode being greater than a second leakage current flowing through the source electrode and drain electrode of the field-effect transistor when a voltage having a threshold value or less is applied between the gate electrode and source electrode of the field-effect transistor, and a relationship between the first leakage current and a voltage between the drain electrode and the source electrode falling within a safe operating area of the field-effect transistor.

2. The rectifier circuit of claim 1,
wherein a breakdown voltage between the gate electrode and source electrode of the field-effect transistor in the reverse bias mode, where the potential at the second terminal is higher that the potential at the first terminal, is set higher than the breakdown voltage of the rectifier element.

3. The rectifier circuit of claim 1, further comprising:
an inductor element disposed on a flow path of a reverse current, and connected to at least one of the drain electrode and source electrode of the field-effect transistor.

4. The rectifier circuit of claim 1,
wherein the rectifier element is a silicon Schottky barrier diode, a silicon P-N junction diode, or a silicon PIN (P-Intrinsic-N) diode.

5. The rectifier circuit of claim 4,
wherein the Schottky barrier diode comprises a JBS (Junction Barrier Schottky) structure or a TMBS (Trench MOS Barrier Schottky) structure.

6. The rectifier circuit of claim 1,
wherein the field-effect transistor is a normally-on type HEMT (High Electron Mobility Transistor), MES (Metal-Semiconductor) FET, MOSFET, or SIT (Static Induction Transistor).

7. The rectifier circuit of claim 1,
wherein the field-effect transistor is formed using a nitride semiconductor material, silicon carbide, or a semiconductor material having a larger band gap than silicon.

8. A rectifier circuit comprising:
a rectifier element and a unipolar field-effect transistor connected in series between a first terminal and a second terminal,
wherein the rectifier element comprises a first electrode and a second electrode disposed in a direction of a forward current flowing from the first terminal to the second terminal,
the field-effect transistor comprises:
a gate electrode having a potential identical to a potential at the first electrode; and
a source electrode and a drain electrode connected in series to the rectifier element and passing a current depending on the potential at the gate electrode,
a breakdown voltage between the gate electrode and drain electrode of the field-effect transistor in a reverse bias mode, where a potential at the second terminal is higher than a potential at the first terminal, being higher than a breakdown voltage of the rectifier element, and
in the rectifier element and the field-effect transistor, when the rectifier element switches to the reverse bias mode, a junction capacitance of the rectifier element being completely charged while the reverse bias mode is applied, and a current flowing from the rectifier element to the source electrode and drain electrode of the field-effect transistor while the junction capacitance is charged falling within a safe operating area of the field-effect transistor.

9. The rectifier circuit of claim 8,
wherein a breakdown voltage between the gate electrode and source electrode of the field-effect transistor in the reverse bias mode, where the potential at the second terminal is higher that the potential at the first terminal, is set higher than the breakdown voltage of the rectifier element.

10. The rectifier circuit of claim 8, further comprising:
an inductor element disposed on a flow path of a reverse current, and connected to at least one of the drain electrode and source electrode of the field-effect transistor.

11. The rectifier circuit of claim 8,
wherein the rectifier element is a silicon Schottky barrier diode, a silicon P-N junction diode, or a silicon PIN (P-Intrinsic-N) diode.

12. The rectifier circuit of claim 11,
wherein the Schottky barrier diode comprises a JBS (Junction Barrier Schottky) structure or a TMBS (Trench MOS Barrier Schottky) structure.

13. The rectifier circuit of claim 8,
wherein the field-effect transistor is a normally-on type HEMT (High Electron Mobility Transistor), MES (Metal-Semiconductor) FET, MOSFET, or SIT (Static Induction Transistor).

14. The rectifier circuit of claim 8,
wherein the field-effect transistor is formed using a nitride semiconductor material, silicon carbide, or a semiconductor material having a larger band gap than silicon.

15. A rectifier circuit comprising:
a rectifier element and a unipolar field-effect transistor connected in series between a first terminal and a second terminal,
wherein the rectifier element comprises a first electrode and a second electrode disposed in a direction of a forward current flowing from the first terminal to the second terminal,
the field-effect transistor comprises:
a gate electrode having a potential identical to a potential at the first electrode; and
a source electrode and a drain electrode connected in series to the rectifier element and passing a current depending on the potential at the gate electrode,
a breakdown voltage between the gate electrode and drain electrode of the field-effect transistor in a reverse bias mode, where a potential at the second terminal is higher than a potential at the first terminal, being higher than a breakdown voltage of the rectifier element,
in the rectifier element and the field-effect transistor, a first leakage current flowing through the rectifier element in the reverse bias mode being greater than a second leakage current flowing through the source electrode and drain electrode of the field-effect transistor when a voltage having a threshold value or less is applied between the gate electrode and source electrode of the field-effect transistor, and a relationship between the first leakage current and a voltage between the drain electrode and the source electrode falling within a safe operating area of the field-effect transistor, and
in the rectifier element and the field-effect transistor, when the rectifier element switches to the reverse bias mode, a junction capacitance of the rectifier element being completely charged while the reverse bias mode is applied, and a current flowing from the rectifier element to the source electrode and drain electrode of the field-effect transistor while the junction capacitance is charged falling within a safe operating area of the field-effect transistor.

16. The rectifier circuit of claim 15,
wherein a breakdown voltage between the gate electrode and source electrode of the field-effect transistor in the reverse bias mode, where the potential at the second terminal is higher that the potential at the first terminal, is set higher than the breakdown voltage of the rectifier element.

17. A rectifier circuit comprising:
a rectifier element and a unipolar field-effect transistor connected in series between a first terminal and a second terminal; and
a constant current source capable of supplying a leakage current flowing through the rectifier element during a period of a reverse bias mode where a potential at the second terminal is higher than a potential at the first terminal,
wherein the rectifier element comprises a first electrode and a second electrode disposed in a direction of a forward current flowing from the first terminal to the second terminal,
the field-effect transistor comprises:
a gate electrode having a potential identical to a potential at the first electrode; and a source electrode and a drain electrode connected in series to the rectifier element and passing a current depending on the potential at the gate electrode, a breakdown voltage between the gate electrode and drain electrode of the field-effect transistor in the reverse bias mode, where the potential at the second terminal is higher than the potential at the first terminal, being higher than a breakdown voltage of the rectifier element, and in the rectifier element and the field-effect transistor, a first leakage current that flows through the rectifier element in the reverse bias mode being greater than a second leakage current that flows through the source electrode and drain electrode of the field-effect transistor while a voltage equal to or lower than a threshold value is applied between the gate electrode and source electrode of the field-effect transistor.

18. The rectifier circuit of claim 17,
wherein the constant current source is connected in parallel between the drain and source electrodes of the unipolar field-effect transistor.

19. The rectifier circuit of claim 17,
wherein the constant current source is a normally-on type field-effect transistor having a source and a gate connected to each other.

20. The rectifier circuit of claim 17
wherein the constant current source is a normally-on type field-effect transistor having a channel a portion of which is contracted.

\* \* \* \* \*